United States Patent [19]

Wahl et al.

[11] Patent Number: 4,878,016
[45] Date of Patent: Oct. 31, 1989

[54] SOLDERING IRON TESTING METHOD AND APPARATUS

[75] Inventors: William Wahl, Culver City; Kenneth G. Junkert, Woodland Hills, both of Calif.

[73] Assignee: Wahl Instruments, Inc., Culver City, Calif.

[21] Appl. No.: 235,371

[22] Filed: Aug. 23, 1988

[51] Int. Cl.$^4$ ............... G01R 15/12; G01R 31/02; G01K 1/14
[52] U.S. Cl. ............... 324/73 R; 324/510; 324/511; 374/142
[58] Field of Search ............... 324/73 R, 158 R, 510, 324/511; 374/142, 179; 340/595; 219/221, 227, 229, 230, 233, 236, 240

[56] References Cited
U.S. PATENT DOCUMENTS

| | | | |
|---|---|---|---|
| 2,061,487 | 11/1936 | Scott | 324/73 R |
| 3,728,617 | 4/1973 | Potter | 324/510 |
| 4,603,980 | 8/1986 | Berg | 374/142 |

Primary Examiner—Ernest F. Karlsen
Attorney, Agent, or Firm—Freilich, Hornbaker, Rosen & Fernandez

[57] ABSTRACT

A method and apparatus for testing three wire handheld soldering irons by touching the iron's tip to a single point sensor to measure (1) tip temperature (2), tip voltage to ground and (3) tip resistance to ground.

7 Claims, 5 Drawing Sheets

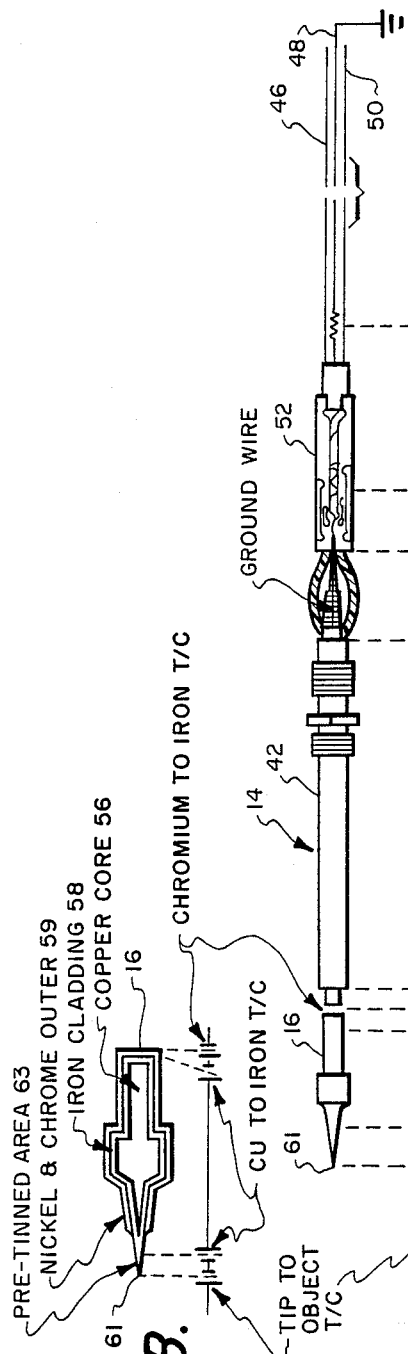
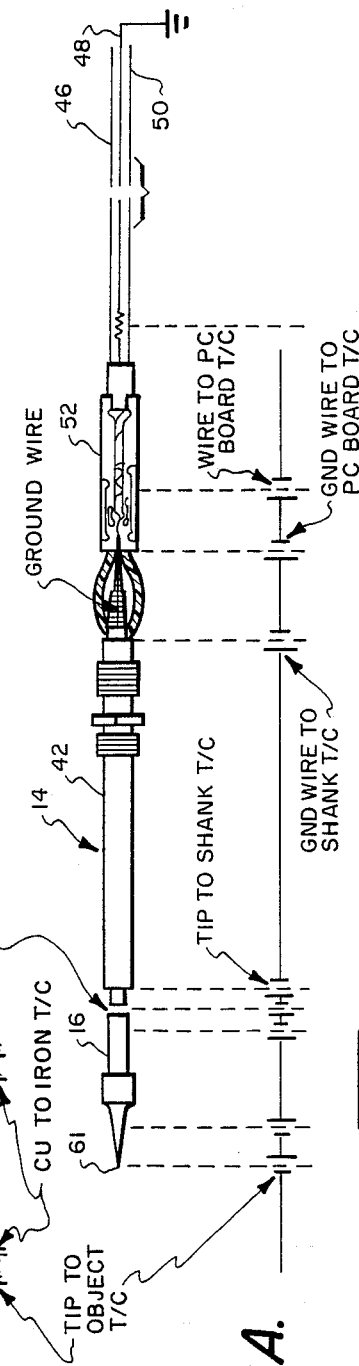
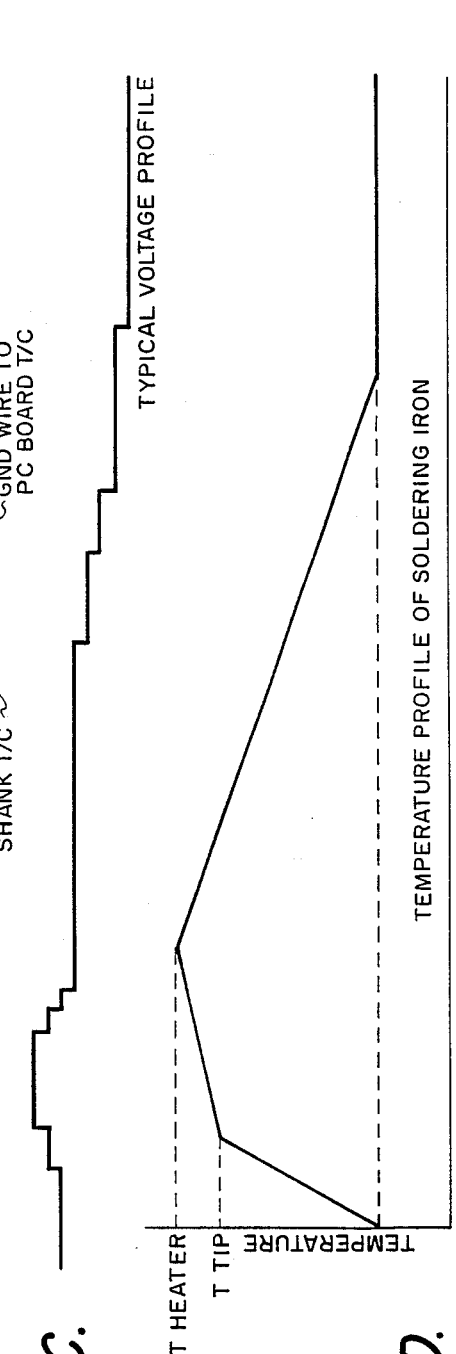
Fig. 2B.
Fig. 2A.
Fig. 2C.
Fig. 2D.

SOLDERING IRON TESTING METHOD AND APPARATUS

FIELD OF THE INVENTION

This invention relates generally to apparatus for testing three wire handheld soldering irons to determine whether various soldering iron operating parameters (i.e. (1) tip temperature, (2) tip voltage to ground, and (3) tip resistance to ground) are within acceptable limits.

BACKGROUND OF THE INVENTION

In order to assure high quality solder joints and avoid damage to sensitive electronic components during production procedures, it is important that various soldering iron operating parameters be maintained within acceptable limits. This fact has been widely recognized and has motivated the adoption of multiple standards and specifications as exemplified by Table I.

TABLE I

REQUIREMENTS OF VARIOUS U.S. GOVERNMENT SPECIFICATIONS

| Applicable Specification | Tip Temperature | Tip Voltage Potential | Tip Ground Resistance |
|---|---|---|---|
| WS-6536E-2 | ±10° F. (max) at idle | ≦2 mV | ≦2 ohms |
| DOD-STD-2000-1B | ±11° F. (max) at idle | ≦2 mV | ≦2/20 ohms |
| DOD-HDBK-263 | No Requirement | <15 V | <20 ohms |
| MIL-STD-45743E | Control ±10° F. (max) | <2 mV | N/A |

Various procedures and equipment have been developed in the prior art to determine the operating parameters of soldering irons. For example only, it has been common practice to measure soldering iron temperature by temporarily replacing the iron's working tip with a special tip having an embedded thermocouple. This procedure is both time consuming and inconvenient, and fortunately, is avoided in a soldering iron tester developed by Anritsu Meter Co. Ltd. The Anritsu model HS2D allows for the measuring of tip temperature by bringing the soldering iron working tip into substantially direct contact with a sensor in the tester. The sensor includes a thermocouple comprised of a pair of dissimilar metal wires mounted so that the junction between the wires is readily accessible for contact by the iron's working tip either directly, or preferably via a solder bead. In addition to providing a convenient means of temperature measurement, the Anritsu sensor also allows for the measurement of both leakage current and DC resistance between the iron's working tip and each of the soldering iron's two AC supply lines.

Although the Anritsu unit is very convenient to use and functions satisfactorily for its limited application, it lacks the capability to test industrial type three wire (i.e. 2 hot wires plus a ground wire) soldering irons for the more significant electrical parameters of voltage and resistance to ground. The desirability of testing for these parameters is discussed in a paper entitled "Solder-Iron Temperature Test Methods" presented by William Wahl at the *China Lake Soldering Techniques Conference*, China Lake, California on Aug. 18, 19 1987.

SUMMARY OF THE INVENTION

The present invention is directed to an improved method and apparatus for testing three wire soldering irons (including related heating devices such as desoldering devices) by touching the iron's working tip to a single sensor to successively measure (1) tip temperature, (2) tip voltage to ground and (3) tip resistance to ground.

In accordance with the preferred embodiment, the sensor is comprised of first and second dissimilar metal wires joined at a junction to form a thermocouple. The wires are mounted so that the junction is readily accessible for contact by the working tip of a soldering iron. The remote or second ends of the two thermocouple wires are selectively connected through a switching means to either a temperature measuring circuit or a voltage measuring circuit or a resistance measuring circuit.

In accordance with the preferred embodiment, in a first switch position, the differential voltage developed across the thermocouple wire second ends is applied to the temperature measuring circuit which produces a temperature indicating output voltage linearly related to the applied voltage and within a normalized voltage range. In a second switch position, the thermocouple wire remote ends are electrically shorted and the voltage at the shorted connection is applied with respect to a reference ground voltage to the voltage measuring circuit which produces a voltage indicating output voltage within the normalized voltage range. Preferably, a common input amplifier is used for both the temperature and voltage measuring circuits. In a third switch position, the thermocouple wire remote ends are also electrically shorted and the resistance measuring circuit supplies a constant current to ground through the shorted thermocouple wires and the iron's tip. The soldering iron thus acts as a circuit load and the resistance measuring circuit produces an output voltage within the normalized voltage range which is indicative of the tip's resistance to ground. By electrically shorting the wires for voltage and resistance measurement, any voltage attributable to thermocouple effect is nulled.

In accordance with a further feature of the preferred embodiment, a display section is provided for responding to the output voltages produced by each of the aforementioned measuring circuits for producing a visual numerical representation of the measured parameter. Additionally, the display section includes threshold means for visually indicating whether or not the measured parameter lies within an acceptable predetermined range.

In accordance with a still further feature of the invention, a guide surface is provided adjacent to the sensor to facilitate accurately locating the soldering iron tip relative to the sensor junction to yield more consistent measurements.

DESCRIPTION OF THE FIGURES

FIG. 2 is a schematic representation of a typical three wire handheld soldering iron showing multiple small thermocouple voltages typically generated, FIG. 2B is an enlarged representation of the soldering iron tip, FIG. 2C comprises a typical voltage profile over the length of the soldering iron, and FIG. 2D depicts a typical temperature profile over the iron's length;

DETAILED DESCRIPTION

Figure 1:
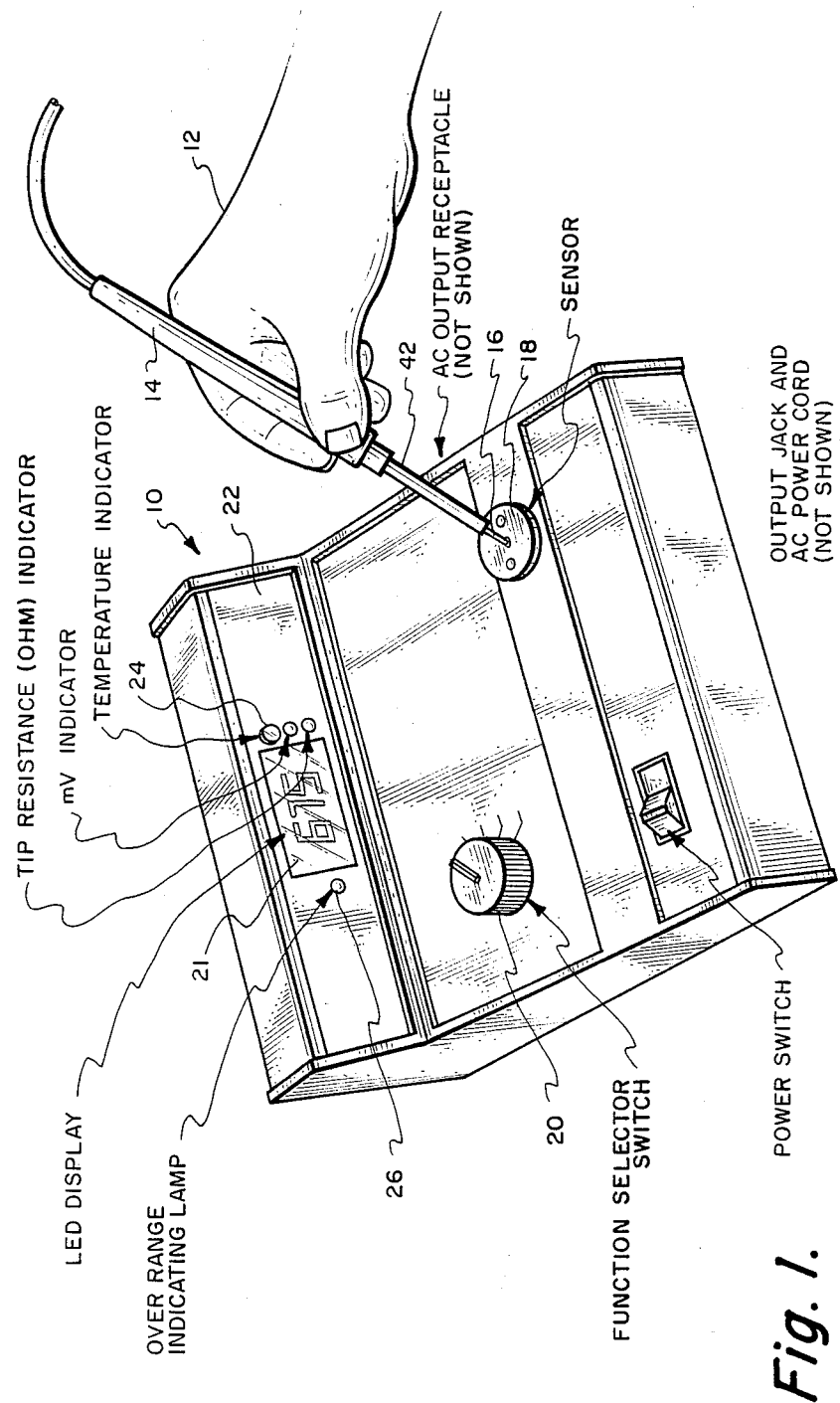
FIG. 1 is a perspective exterior view of a preferred apparatus in accordance with the present invention.

In recognition of the fact that semiconductor and other components can be damaged by current leakage, induced voltage, or temperature extremes, various standards have been adopted for industrial soldering irons to prevent such damage and assure high quality solder joints. In order to permit soldering iron performance to be readily tested for compliance with such standards, a testing apparatus 10, depicted in FIG. 1, is provided in accordance with the present invention. The apparatus 10 enables a user 12 to test the performance of the soldering iron 14 by merely touching the soldering iron tip 16 to a single point sensor 18. With the tip 16 in contact with the sensor 18, the user is able to selectively rotate a function switch 20 to any one of multiple positions to check for different soldering iron operating parameters.

More specifically, with the switch 20 in a first or temperature position, the apparatus 10 will measure the temperature of the tip 16 and will display a numeric value representative of the temperature within a window 21 on display panel 22. By rotating the switch 20 to a second position, the window 21 will display the numeric value of the voltage between the tip 16 and electrical ground. By rotating the switch 20 to a third position, window 21 will display the numerical value of the resistance between the tip 16 and electrical ground. The preferred apparatus 10 depicted in FIG. 1 additionally shows a fourth rotational position for the switch 20 to indicate resistance for a different range. That is, in the preferred embodiment, the third and fourth positions both measure tip resistance to ground but with respect to different limits, i.e. 2 ohms and 20 ohms.

In addition to window 21 for displaying numeric values, display panel 22 preferably includes indicator lights 24 which illuminate to readily identify to the user the active measurement mode, i.e. the current position of switch 20. Additionally, the display panel 22 includes an over range indicating lamp 26 which illuminates whenever the numeric value displayed in window 21 is outside a predetermined acceptable range.

Prior to discussing in detail the characteristics of sensor 18 and the electronic system for measuring temperature, voltage, and resistance parameters to control display panel 22, attention is directed to FIGS. 2A-2D which depict a typical three wire handheld industrial soldering iron 14 (outer casing not shown) intended to be tested by the apparatus 10 in accordance with the invention.

The soldering iron 14 is comprised of an elongated shank 42 to which a replaceable working tip 16 is attached. The soldering iron 14 is electrically powered by three supply wires 46, 48, and 50. Wire 48 is typically connected to the third or ground wire of a conventional industrial or residential three wire electrical power system. The wires 46 and 50 are "hot" wires and are typically connected by a circuit board 52 to a heater (not shown) in shank 42 which is closely thermally coupled to tip 16. The electrical ground on wire 48 is connected through the shank 42 to tip 16.

FIG. 2B depicts in cross-section the multiple metal materials used in a typical soldering iron tip 16. Thus, for example, the tip would typically have a copper core 56 having a layer of iron cladding 58 thereon. A nickel and chrome outer layer 59 typically envelops the iron cladding except for the area immediately adjacent the end 61 of the tip 16 which is tinned as at 63. As a consequence of the dissimilar materials of the tip 16, multiple thermally induced voltages are typically produced in the normal use of the soldering iron as are depicted in FIGS. 2A and 2B. FIG. 2A depicts still further such thermocouple voltages developed along the length of the soldering iron 14. FIG. 2C depicts a typical voltage profile along the length of the soldering iron 14 during normal heated operation. FIG. 2D depicts a typical corresponding temperature profile. Because of the damage that can be produced by voltages or temperatures which exceed a predetermined range, the purpose of the apparatus 10 is to enable a user to readily determine whether the soldering iron is performing properly. In accordance with the present invention, and in order to comply with existing specifications, the apparatus 10 has been designed to specifically measure the true temperature of a working tip 16, its true RMS voltage with respect to electrical ground and its true resistance from the tip to electrical ground.

Figure 3A:
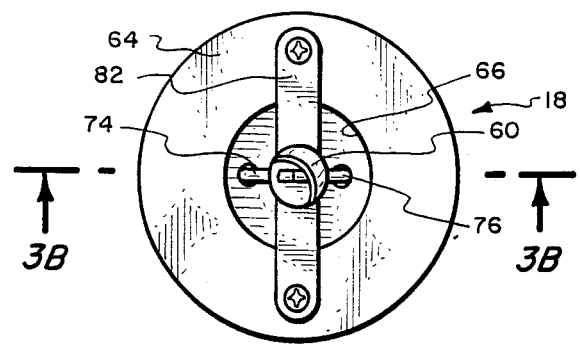
FIG. 3A is a plan view of a preferred sensor used in the tester of FIG. 1.
Figure 3B:
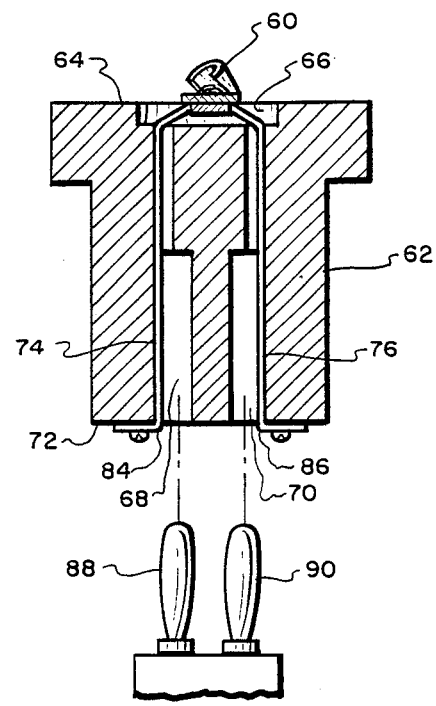
FIG. 3B is a sectional view taken substantially along the plane 3B—3B of FIG. 3A
Figure 3C:
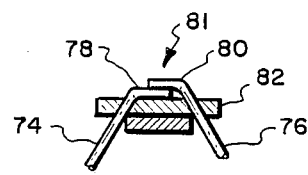
FIG. 3C is an enlarged sectional view of the sensor theromcouple junction.

In order to perform these measurements, apparatus 10 includes a sensor 18 which can, for example, comprise the same thermocouple sensor DHC-1 used in the aforementioned Anritsu soldering iron tester, but which preferably is modified to include a guide member 60 as depicted in FIG. 3A and 3B.

Briefly, the sensor 18 is comprised of a substantially cylindrical body 62 formed of electrically and thermally insulating material such as ceramic or glass filled Teflon. The body 62 has an upper surface 64 which has a shallow well 66 extending therein. First and second openings 68 and 70 extend from the lower surface 72 of the body 62 and open into the well 66. First and second thermocouple wires 74 and 76 of dissimilar material are respectively accommodated in openings 68 and 70. The first ends 78 and 80 of the wires 74 and 76 are physically interconnected, as by welding, to form a junction 81 adjacent to the well 66, preferably being supported by a low thermal conductivity member, e.g. a stainless steel strap 82. The second ends 84, 86 of the thermocouple wires 74, 76 respectively are adapted to be electrically contacted by conventional banana plugs 88 and 90 for interconnection to the signal processing circuitry to be discussed hereinafter in connection with FIGS. 4 and 5A-5C.

Before discussing FIGS. 4 and 5A-5C, it is noted that in using the apparatus 10 of FIG. 1, the soldering iron 14 and soldering iron tester 10 should preferably be plugged into AC receptacles of the same three wire power system so that they share the identical system ground wire. Then, to use the apparatus 10, the user would place the active end 61 of the soldering iron tip 16 against the junction 81 and supply solder to form a solder bead thereon. The guide surface 60 is provided for engaging the side and forward end of the tip 16 to facilitate accurately locating the tip end adjacent the junction 81. The guide surface is configured to limit the forward and side to side travel of the tip to better assure consistent measurement. The user should preferably apply the same firm pressure to the solder bead at the junction as is applied in normal soldering. With the tip so positioned, the user can then rotate the switch 20 to successively produce numerical readouts within the display window 21 to indicate the soldering iron's operating parameters.

Figure 4:
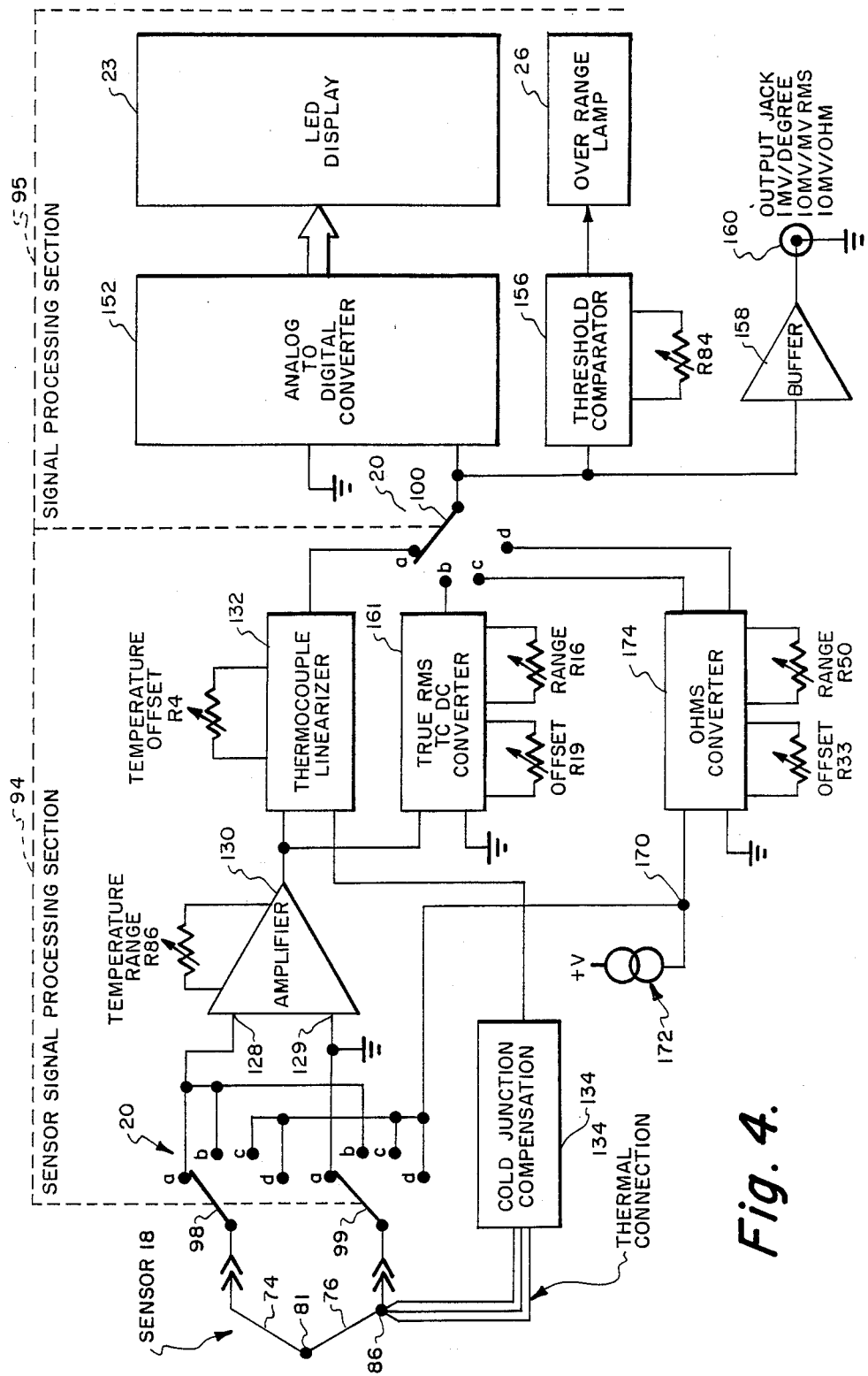
FIG. 4 is a block diagram of a preferred signal processing system in accordance with the invention.
Figure 5A:
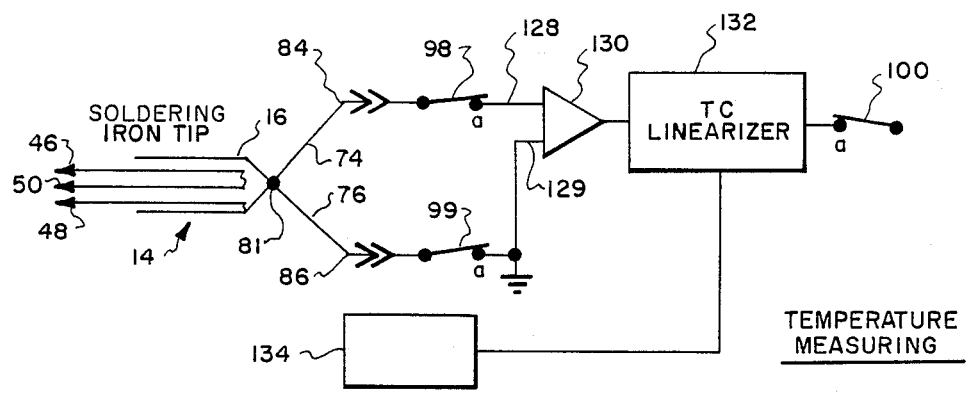
FIG. 5A is a schematic representation of the temperature measuring circuit, FIG. 5B of the voltage measuring circuit, and FIG. 5C of the resistance measuring circuit, all with respect to the system depicted in FIG. 4.
Figure 5B:
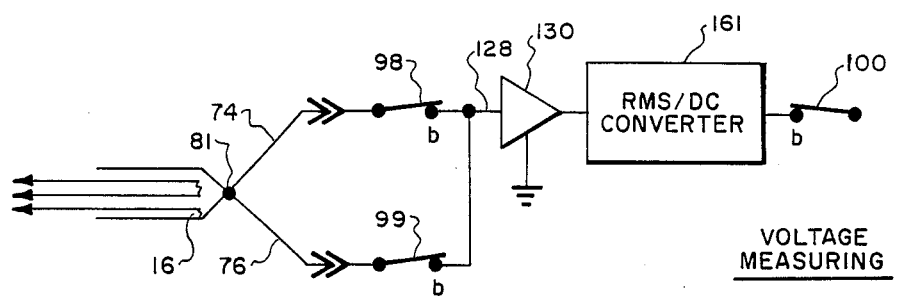
Figure 5C:
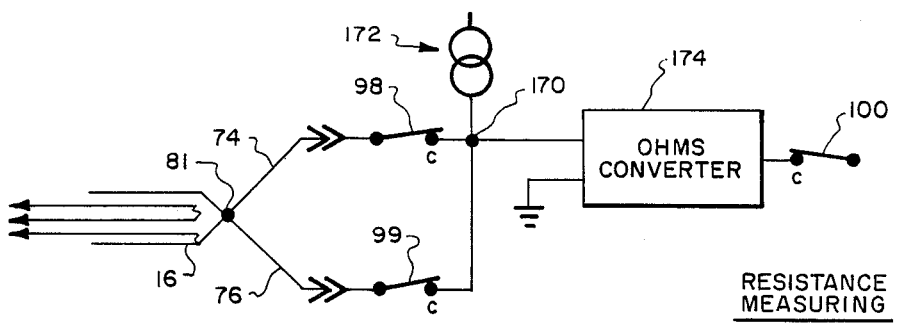

Attention is now directed to FIG. 4 which comprises a block diagram of the electronic system housed within the casing of apparatus 10 for responding to the contact between the soldering iron tip 16 and the sensor junction 81 to drive the display panel 22. Basically as shown in FIG. 4, the system is comprised of a sensor signal processing section 94 and a display signal processing section 95. Signal processing section 94 is essentially comprised of three different processing circuit paths which respectively function to perform temperature measuring, voltage measuring, and resistance measuring as defined by the position of the function switch 20. For clarity in explanation, the three respective processing paths are depicted separately in FIGS. 5A, 5B, 5C. The three paths of processing section 94 all develop DC normalized output voltages which are supplied to the common display signal processing section 95 for driving the display panel 22.

The function switch 20 is schematically depicted in FIG. 4 as being comprised of three ganged stages respectively comprised of movable contacts 98, 99, 100, each respectively associated with four fixed contacts a, b, c, d. When switch 20 is in the temperature measuring mode position, movable contacts 98, 99, 100 are connected to fixed contacts a. When in the voltage measuring mode, contacts 98, 99, 100 connect to contacts b. When in the resistance measuring mode, contacts 98, 99, 100 connect to contacts c for the 2 ohm range and to contacts d for the 20 ohms range. As shown in FIG. 4 switch contacts 98, 99 function to connect sensor 18 to signal processing section 94 and switch contact 100 functions to connect the multiple output voltages produced by section 94 to display section 95. It should, of course, be realized that although switch 20 is represented in FIG. 4 as an electromechanical switch, it could be readily implemented by electronic switches.

With switch contacts 98, 99 connected to contacts a, note that the differential voltage developed between the ends 84, 86 of the thermocouple wires 74, 76 is applied across the input terminals 128, 129 of amplifier 130. The output of amplifier 130 is applied to the input of thermocouple linearizer circuit 132. A second input to circuit 132 is derived from the output of a cold junction compensation circuit 134 which responds to the ambient temperature at thermocouple wire end 86 to develop an ambient temperature compensation signal. That is, compensation circuit 134 provides an output signal which is essentially indicative of ambient temperature whereas amplifier 130 produces an output signal directly related to the differential temperature between the soldering iron tip and ambient. The thermocouple linearizer circuit 132 produces a DC output voltage normalized within a predetermined voltage range which is representative of the absolute temperature of the tip 61 contacting sensor junction 81. FIG. 4 illustrates amplifier 130 as including a trim resistor R86 for adjusting the amplifier gain to control the output voltage swing. The linearizer circuit 132 is shown as having a trim resistor R4 which is used to adjust for zero offset.

With the switch 20 in the temperature measuring mode, linearizer 132 will supply a normalized DC output voltage via contact 100 to the system's display stage 95. The display stage 95 includes an analog to digital converter circuit 152 which drives a light-emitting diode assembly for producing the numerical readout in window 21 of display panel 22. Additionally stage 95 includes a threshold comparator 156 for illuminating the overrange indicating light 26 when the voltage applied to contact 100 exceeds a threshold level. Contact 100 also connects to the input of buffer 158 for driving an external device, e.g. recorder, via an output jack 160.

When the switch 20 is rotated to its second or voltage measuring mode position, movable contacts 98, 99 engage fixed contacts b which are directly interconnected, to thus electrically short the thermocouple wire ends 84, 86. As a consequence, the thermocouple voltage component developed across wires 74 and 76 will be nulled with respect to amplifier 130. In other words, the potential at amplifier input terminal 128 will be identical to that at sensor junction 81 which, of course, will be the voltage on soldering iron tip 16. Inasmuch as amplifier input terminal 129 is grounded, amplifier 130 will output a voltage referenced to ground, to the RMS voltage to DC converter circuit 161. Circuit 161 functions to supply a normalized DC voltage to contact 100 representative of the RMS output of amplifier 130. The DC voltage produced at contact 100 is then applied to the display section 95 as previously described. Trim resistors R19 and R16 are respectively provided to control the zero offset and range of convertor.

When the switch 20 is in the resistance measuring mode, movable contacts 98, 99 will be connected either to fixed contacts c for the 2 ohm range or d for the 20 ohm range. Note that fixed contacts c associated with movable contacts 98, 99 are interconnected to one another. Similarly, contacts d are interconnected to one another. Thus, in either of these resistance measuring positions of switch 20, the thermocouple wires 74 and 76 will be electrically shorted. The shorted connection in either case is connected to circuit load point 170. Also connected to circuit point 170 is a constant current source 172 which supplies a current through the electrically shorted thermocouple wires 74, 76 and junction 81 to the soldering iron tip 16. The resulting voltage produced at load point 170 is applied to the input of an ohms converter circuit 174. The converter circuit 174 provides normalized DC output voltages at fixed contacts c and d associated with movable contact 100 for 2 ohm and 20 ohm ranges. Trim resistors R33 and R50 respectively control the zero offset and output voltage swing of the converter circuit 174. The DC output voltages supplied by converter circuit 174 are then coupled via movable contact 100 to drive the display section 95 as previously discussed.

Thus, from the foregoing it should be appreciated that a method and apparatus for testing three wire soldering irons (including desoldering devices) has been disclosed herein which enables the tip of the soldering iron to be tested for temperature, voltage to ground, and resistance to ground by merely touching the tip to a single point comprising the junction of a pair of thermocouple wires. With the soldering iron held in contact with the junction, the multiple soldering iron parameters can be hecked by merely rotating a function switch 20. In the temperature measuring mode, the differential voltage developed across the two thermocouple wires 74, 76 is applied as a differential input to amplifier 130. In the voltage measuring mode, the thermocouple wires 74, 76 are electrically shorted so that the voltage on the sensor junction is applied as a single-ended signal with respect to ground to amplifier input terminal 128. In the resistance measuring mode, the thermocouple wires are likewise electrically shorted enabling a constant current source 172 to supply current through the thermocouple wires to the soldering iron acting as a load.

We claim:

1. Apparatus, useful in combination with a soldering iron having a working tip nominally connected to electrical ground, for measuring the (1) tip temperature (2) tip voltage to ground, and (3) tip resistance to ground, said apparatus comprising:

sensor means including first and second dissimilar metal wires each having first and second ends with said first ends being joined at a junction to form a thermocouple;

means mounting said sensor means with said junction readily accessible for contact by said working tip;

temperature measuring means responsive to an applied input voltage for producing an output voltage related thereto;

voltage measuring means responsive to an applied input voltage for producing an output voltage related thereto;

resistance measuring means including current source means for supplying a constant current to a load terminal and means for producing an output voltage related to the voltage drop produced between ground and said load terminal; and switching means operable in a temperature mode for applying the voltage between said first and second wire second ends to said temperature measuring means; operable in a voltage mode for electrically shorting said first and second wire second ends and applying the resulting shorted voltage appearing between the shorted second ends and ground to said voltage measuring means; and operable in a resistance mode for electrically shorting said first and second wire second ends and connecting said second ends to said resistance measuring means load terminal.

2. The apparatus of claim 1 including display means responsive to the output voltages respectively produced by said temperature measuring means, said voltage measuring means, and said resistance measuring means for producing a visual numerical representation thereof.

3. The apparatus of claim 2 wherein said display means further includes threshold means for visually indicating whether or not each of said output voltages is within a predetermined range.

4. The apparatus of claim 3 wherein said temperature measuring means and said voltage measuring means includes a common input amplifier.

5. The apparatus of claim 1 wherein said sensor means includes guide means mounted adjacent to said junction for engaging said soldering iron to locate said tip relative to said junction.

6. A method for testing a soldering iron having a working tip for determining the tip temperature, the tip voltage to ground, and the tip resistance to ground, said method including the steps of:

touching said working tip to a junction formed by the first ends of first and second electrically conductive members comprising a thermocouple;

then sequentially (1) measuring the differential voltage produced across the second ends of said thermocouple members and converting said differential voltage to a temperature indicating output voltage within a normalized range;

(2) connecting an electrical short across the second ends of said thermocouple members, measuring the voltage produced at said shorted connection with respect to ground, and converting said measured voltage to a voltage indicating output voltage within a normalized range;

(3) connecting an electrical short across the second ends of said thermocouple members, supplying a constant current through said shorted connection to said junction, measuring the voltage produced at said shorted connection with respect to ground, and converting said measured voltage to a resistance indicating output voltage within a normalized range; and responding to said output voltages to produce a visual display respectively indicating the magnitude of said tip temperature, voltage, and resistance.

7. The method of claim 6 including the further steps of visually indicating whether or not the magnitudes of said tip temperature, voltage, and resistance are within a predetermined range.

* * * * *